(12) United States Patent
Kitagawa et al.

(10) Patent No.: US 11,245,059 B2
(45) Date of Patent: Feb. 8, 2022

(54) WIRING BOARD AND LIGHT EMITTING DEVICE

(71) Applicant: KYOCERA Corporation, Kyoto (JP)

(72) Inventors: Akihito Kitagawa, Kyoto (JP); Yoshiaki Itakura, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 9 days.

(21) Appl. No.: 16/650,998

(22) PCT Filed: Sep. 25, 2018

(86) PCT No.: PCT/JP2018/035459
§ 371 (c)(1),
(2) Date: Mar. 26, 2020

(87) PCT Pub. No.: WO2019/065633
PCT Pub. Date: Apr. 4, 2019

(65) Prior Publication Data
US 2020/0303606 A1 Sep. 24, 2020

(30) Foreign Application Priority Data

Sep. 26, 2017 (JP) .............................. JP2017-185337

(51) Int. Cl.
*H01L 33/60* (2010.01)
*H01L 33/62* (2010.01)

(52) U.S. Cl.
CPC .............. *H01L 33/60* (2013.01); *H01L 33/62* (2013.01)

(58) Field of Classification Search
CPC ............................... H01L 33/60; H01L 33/62
See application file for complete search history.

(56) References Cited

U.S. PATENT DOCUMENTS

2007/0215895 A1 9/2007 Amoh et al.
2017/0288096 A1* 10/2017 Yamanoi ............... H01L 25/167

FOREIGN PATENT DOCUMENTS

| JP | 2004-134699 A | 4/2004 |
| JP | 2005-303012 A | 10/2005 |
| JP | 2013-214677 A | 10/2013 |
| JP | 2013214677 A * | 10/2013 |
| JP | 2017-092500 A | 5/2017 |

OTHER PUBLICATIONS

Hawkeye et al., "Glancing angle deposition: Fabrication, properties, and applications of micro- and nanostructured thin films," Journal of Vacuum Science & Technology A 25, 1317 (2007).

* cited by examiner

*Primary Examiner* — Marcos D. Pizarro
*Assistant Examiner* — Antonio B Crite
(74) *Attorney, Agent, or Firm* — Volpe Koenig

(57) ABSTRACT

A wiring board includes a substrate for mounting a light emitting element; and a reflective film positioned on a surface of the substrate and reflecting light rays that are emitted from the light emitting element. The reflective film is formed of a plurality of adjacent columnar crystals extending in a perpendicular direction with respect to the surface of the substrate. A surface of the plurality of adjacent columnar crystals is in continuous at a surface of the reflective film.

20 Claims, 4 Drawing Sheets

WIRING BOARD AND LIGHT EMITTING DEVICE

TECHNICAL FIELD

The present invention relates to a wiring board for mounting a light emitting element and a light emitting device including the wiring board.

BACKGROUND ART

In recent years, a deep ultraviolet LED element is attracting attention as a deep ultraviolet light emitting element. Among the deep ultraviolet LEDs, a UVC-LED is expected to be used for sterilization, water purification, air cleaning, and the like, instead of a mercury lamp having a concern about an environmental problem.

On the other hand, the following PTL 1 discloses a casing having a cup-shaped portion in which an LED element is mounted. A reflective film is positioned on an inner circumferential surface of the cup-shaped portion so as to surround the LED element. The reflective film is formed by aluminum vacuum deposition, and serves to direct visible light emitted from the LED element to a predetermined direction (see Japanese Unexamined Patent Application Publication No. 2004-134699).

SUMMARY OF INVENTION

A wiring board according to the present disclosure includes a substrate for mounting a light emitting element, and a reflective film positioned on a surface of the substrate and reflecting light rays that are emitted from the light emitting element, in which the reflective film is formed of a plurality of adjacent columnar crystals extending in a perpendicular direction with respect to the surface of the substrate, and a surface of the plurality of adjacent columnar crystals is in continuous at a surface of the reflective film.

A light emitting device according to the present disclosure includes the wiring board in above configuration, and the light emitting element mounted on the substrate.

BRIEF DESCRIPTION OF DRAWINGS

FIG. 4A is a scanning electron microscope (SEM) image, and FIG. 4B is an inverse pole figure (IPF) map illustrating distribution of a crystal orientation in FIG. 4A.

DESCRIPTION OF EMBODIMENTS

The term "comprise" used in the present specification and claims also includes cases having a component other than those depicted therein. The terms "have", "include", and the like are also the same. The term "connect" in the present specification and claims means a case of connecting components to each other via a component other than that depicted therein. For example, a case of connecting one component to component A includes a case of connecting the component to component A via component B or the like, in addition to a case of connecting the component to component A directly. Hereinafter, an embodiment of the present disclosure (hereinafter, referred to as "embodiment") will be described with reference to the accompanying drawings.

Figure 1A:
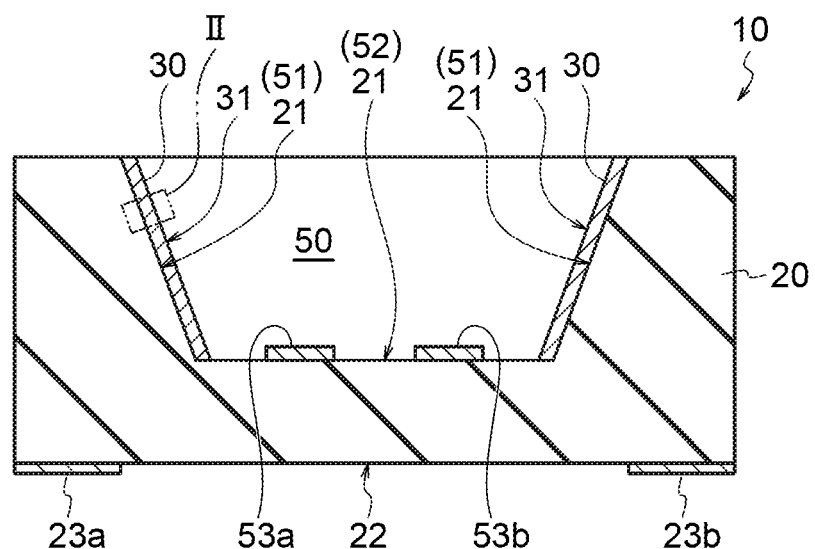
FIG. 1A is a cross-sectional view illustrating a wiring board according to the present embodiment.
Figure 1B:
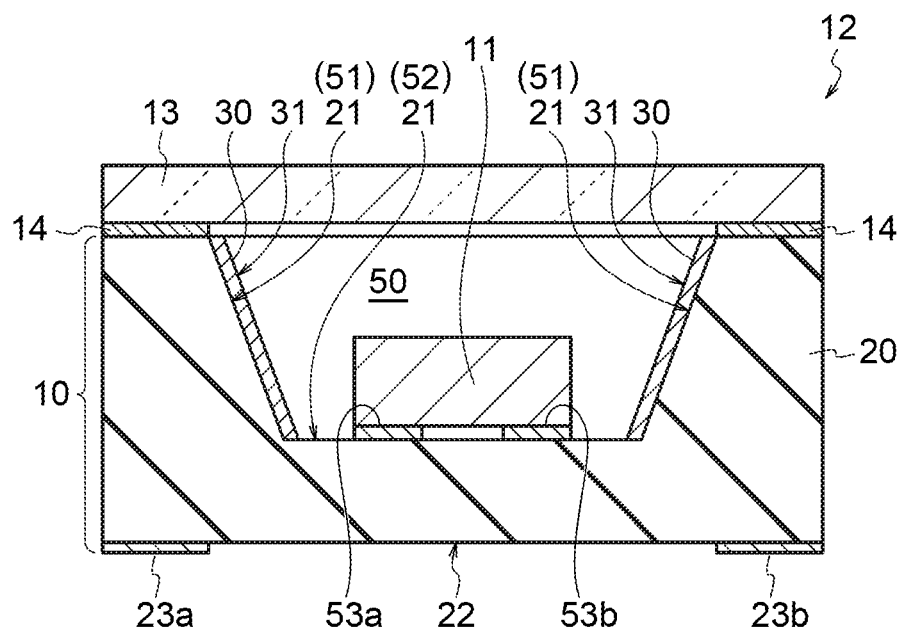
FIG. 1B is a cross-sectional view illustrating a light emitting device according to the present embodiment.
Figure 2:
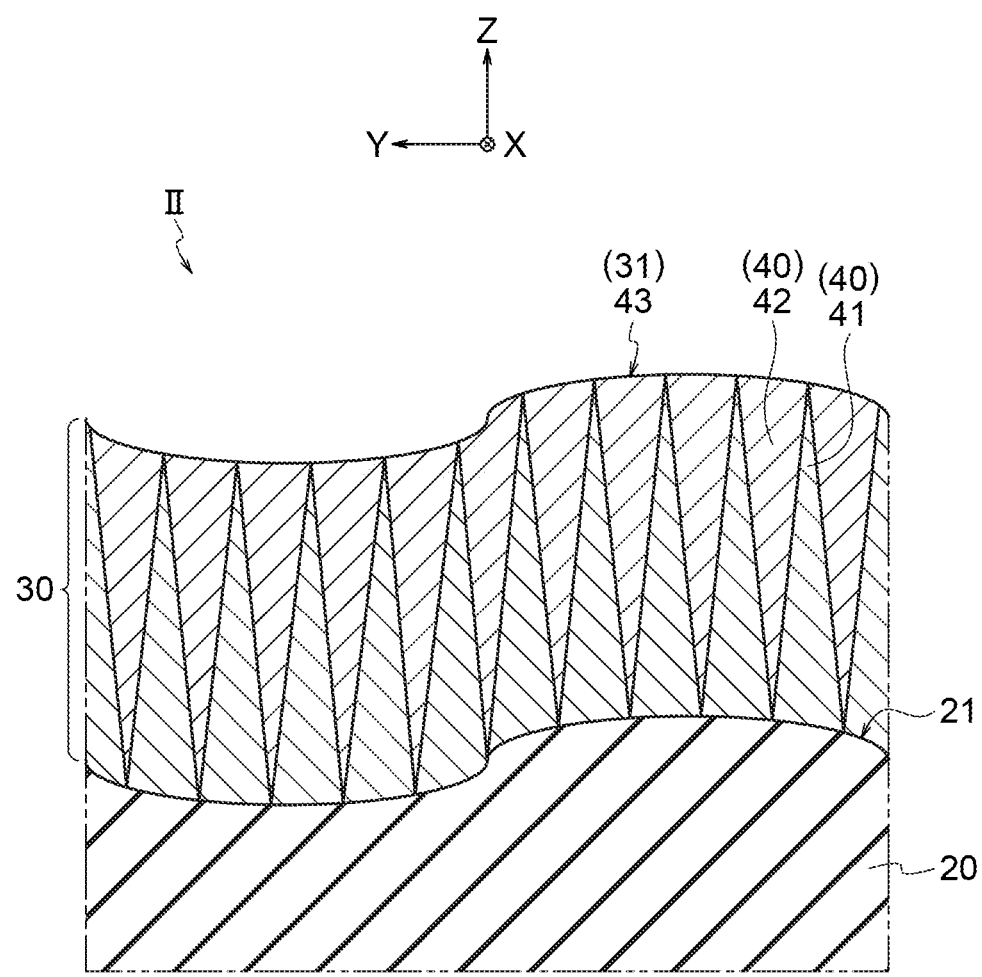
FIG. 2 is an enlarged cross-sectional view illustrating a portion II in FIG. 1A.

FIG. 1A is a cross-sectional view illustrating a wiring board according to the present embodiment, and FIG. 1B is a cross-sectional view illustrating a light emitting device according to the present embodiment. FIG. 2 is an enlarged cross-sectional view illustrating a portion II in FIG. 1A. Hereinafter, the embodiment will be described with reference to FIGS. 1 and 2. In FIG. 2, a right-handed three-dimensional coordinate is set in which a plane averaging a surface 21 of a substrate 20 is defined as an XY plane and a direction perpendicular to the XY plane is defined as a Z direction.

As illustrated in FIG. 1A and FIG. 1B, a wiring board 10 according to the present embodiment includes a substrate 20 for mounting a light emitting element 11 and a reflective film 30 positioned on a surface 21 of the substrate 20 and reflecting light rays that are emitted from the light emitting element 11. As illustrated in FIG. 2, the reflective film 30 is formed of a plurality of columnar crystals 40 extending in a perpendicular direction (Z direction) with respect to the surface 21 of the substrate 20. A surface 43 of the adjacent columnar crystals 40 is in continuous at a surface 31 of the reflective film 30.

The reflective film 30 serves to provide predetermined directivity to light rays emitted from the light emitting element 11. In this case, if unevenness is formed on the surface of the reflective film 30, since light rays are reflected irregularly and difficult to give predetermined directivity, reflectance decreases. This tendency becomes remarkable as a wavelength of light rays gets shorter. In the present embodiment, the reflective film 30 is formed of the plurality of columnar crystals 40 extending in the perpendicular direction with respect to the surface 21 of the substrate 20, and the surface 43 of the adjacent columnar crystals 40 is in continuous at the surface 31 of the reflective film 30, such that the surface of the reflective film 30 becomes a smooth surface without steps, and reflectance for light rays, particularly, light rays with a short wavelength, emitted from the light emitting element 11 can increase.

Further, as illustrated in FIG. 2, the surface 43 of the columnar crystal 40 being continuous at the surface 31 of the reflective film 30 may have the same shape as the surface 21 of the substrate 20 opposite to the continuous surface 43 of the columnar crystal 40 which is continuous at the surface 31 of the reflective film 30. In this case, the surface 31 of the reflective film 30 is parallel to the surface 21 of the substrate 20, such that the unevenness on the surface 31 of the reflective film 30 does not become larger than unevenness on the surface 21 of the substrate 20. Therefore, reflectance to light rays, particularly, light rays with a short wavelength, emitted from the light emitting element 11 can further increase. Note that, "the surface 43 has the same shape as the surface 21" is rephrased as "a distance between the surface 43 and the surface 21 in the Z direction is equal everywhere", or "the surface 43 is parallel to the surface 21" is rephrased as "the surface 21 coincides with the surface 43 if the surface 21 is moved in parallel to the Z direction". In this case, a difference from an average value of the distance between the surface 43 and the surface 21 in the Z direction or a difference from an average value of a distance in which the surface 21 is moved in parallel to the Z direction is ±0.1 μm (or 5% in thickness of the reflective film 30).

As illustrated in FIG. 2, the plurality of columnar crystals 40 may include first columnar crystals 41 being in direct contact with the surface 21 of the substrate 20 and second columnar crystals 42 in contact with the first columnar crystals 41 without being in direct contact with the surface 21 of the substrate 20. In this case, since the first columnar crystal 41 is in direct contact with the surface 21 of the substrate 20, the first columnar crystal 41 has good adhesiveness with the surface 21 of the substrate 20. Since the second columnar crystal 42 is in contact with the first columnar crystal 41 even if the second columnar crystal 42 is not in contact with the surface 21 of the substrate 20, the second columnar crystal 42 has good adhesiveness with the surface 21 of the substrate 20 through the first columnar crystal 41. Therefore, the reflective film 30 formed of the columnar crystals 40 has good adhesiveness with the surface 21 of the substrate 20, such that stress caused by a difference in thermal expansion coefficient thereof can be relaxed and reliability can thus be improved. In other words, temporal decrease in reflectance of the reflective film 30 can be prevented.

The reflective film 30 may be formed of aluminum. Since a crystal structure of the reflective film 30 is obtained by ion plating described later, aluminum is a suitable material in the present embodiment. Ultraviolet (UV, wavelength of 200 to 400 nm) rays are classified into ultraviolet A (UVA, wavelength of 320 to 400 nm), ultraviolet B (UVB, wavelength of 280 to 320 mm), and ultraviolet C (UVC, wavelength of 200 to 280 nm). A deep ultraviolet wavelength indicates a wavelength of 200 to 350 nm.

The light emitting element 11 may emit ultraviolet rays having a wavelength of 200 to 400 nm. For example, the light emitting element 11 may be a UVC-LED element, and in this case, the light emitting element 11 emits light rays having an extremely short wavelength. The reflective film 30 reflects ultraviolet rays having a wavelength of 200 to 400 nm, and an effect of the wiring board 10 described above is more remarkable. With this configuration, the light emitting device 12 emits ultraviolet rays having a wavelength of 200 to 400 nm and the same effect as the wiring board 10 is performed.

As illustrated in FIG. 1B, the light emitting device 12 according to the present embodiment includes the wiring board 10 and the light emitting element 11 mounted on the substrate 20. The light emitting device 12 includes the wiring board 10, such that the same effect as the wiring board 10 is performed.

Next, configurations of the wiring board 10 and the light emitting device 12 according to the present embodiment will be described in more detail.

The substrate 20 has a rectangular plate shape, that is, a rectangular parallelepiped shape, and for example, a plurality of dielectric layers are laminated thereon. Further, a housing recess 50 formed of, for example, a reverse-frustum space is positioned in the substrate 20. Here, the rectangular parallelepiped shape includes a cube, and a frustum includes a truncated pyramid and a truncated cone. The housing recess 50 is a so-called cavity, the surface 21 of the substrate 20 is recessed, and the housing recess 50 has side surfaces 51 to which the reflective films 30 are attached and a bottom surface for mounting the light emitting element 11. That is, the reflective film 30 is positioned to surround the light emitting element 11.

A size and a shape of the housing recess 50 may be appropriately set depending on a size of the light emitting element 11 to be housed or directivity of light rays emitted by the light emitting element 11. An opening shape of the housing recess 50 may be a rectangle, a square, a circle, or other shapes thereof. Electrode pads 53a and 53b are disposed on the bottom surface 52 of the housing recess 50, and external connection terminals 23a and 23b are disposed on a mounting surface 22 of the substrate 20.

The light emitting element 11 is electrically connected to the electrode pads 53a and 53b through a bump or a wire which is a connection member (not illustrated). The external connection terminals 23a and 23b are electrically connected to the electrode pads 53a and 53b through internal wiring or external wiring (not illustrated). A nickel layer having a thickness of 0.5 to 10 μm and a metal layer having a thickness of 0.5 to 5 μm may be sequentially attached to the electrode pads 53a and 53b and the external connection terminals 23a and 23b by a plating method. These layers are effective to enhance wettability with a bonding material, such as solder and enhance corrosion resistance.

The substrate 20 can house the light emitting element 11 and may include a conductor for wiring, and for example, a ceramic wiring board on which the dielectric layer is formed of a ceramic insulating material is preferable. If the substrate 20 is the ceramic wiring board, the conductor is formed on the dielectric layer formed of a ceramic material. The ceramic wiring board is formed of a plurality of ceramic dielectric layers. Examples of the ceramic material used in the ceramic wiring board include an aluminum oxide sintered body, a mullite sintered body, a silicon carbide sintered body, an aluminum nitride sintered body, a silicon nitride sintered body, or glass ceramic sintered body.

Further, the light emitting device 12 includes a lid 13 and a bonding material 14, in addition to the wiring board 10 and the light emitting element 11.

The lid 13 covers the housing recess 50 of the substrate 20. That is, the housing recess 50 in which the light emitting element 11 is housed is sealed with the lid 13 through the bonding material 14. The lid 13 is a plate-shaped member formed of an insulating material, and may be formed of a material having a light-transmissive property and light resistance to light rays emitted by the light emitting element 11. For example, the lid 13 may be formed of an insulating material having a transmittance of preferably 70% or more (more preferably 90% or more) with respect to a wavelength of light rays emitted by the light emitting element 11.

For example, a transparent ceramic material such as sapphire, a glass material, or a resin material can be used as the insulating material formed of the lid 13. Borosilicate glass, crystallized glass, quartz, soda glass, and the like can be used as the glass material. A polycarbonate resin, an unsaturated polyester resin, an epoxy resin, and the like can be used as the resin material.

The bonding material 14 is a sealing material for securing airtightness and watertightness in the housing recess 50 by bonding the substrate 20 and the lid 13. Therefore, the bonding material 14 is provided on the substrate 20 or the lid 13 in a continuous annular shape. Further, it is desirable that the bonding material 14 has a light shielding property. The bonding material 14 has a light shielding property, such that light can be prevented from passing through between the substrate 20 and the lid 13 and leaking from the housing recess 50.

For example, a resin adhesive such as an epoxy resin adhesive or a silicone resin adhesive, or a metal material such as solder can be used as the bonding material 14. The resin adhesive is desirable to disperse a light absorption material. Examples of an inorganic pigment of the light absorption material include a carbon pigment such as carbon black, a nitride pigment such as titanium black, and metal oxide pigments such as Cr—Fe—Co, Cu—Co—Mn, Fe—Co—Mn, and Fe—Co—Ni—Cr pigments. Examples of the metal material such as solder include brazing materials such as Sn—Ag, Sn—Ag—Cu, Au—Sn, Au—Sn—Ag, and Au—Si materials.

Describing a specific example, the light emitting element is a UVC-LED element, the wiring board 10 is a package for UVC-LED, and the light emitting device 12 is a sterilization lamp. The wiring board 10 does not necessarily require the housing recess 50. For example, the reflective film 30 is formed planarly on the surface 21 of the planar substrate 20, and the light emitting element 11 may be mounted on the reflective film 30.

Next, an example of manufacturing methods of the wiring board 10 and the light emitting device 12 according to the present embodiment will be described.

First, the substrate 20 is produced in the same manner as in the known manufacturing method of a multilayer wiring board. If the substrate 20 is a ceramic wiring board and a ceramic material is alumina, a ceramic green sheet (hereinafter, referred to as "green sheet") is obtained by adding an organic solvent or a solvent to raw powder such as alumina ($Al_2O_3$), silica ($SiO_2$), calcia (CaO), and magnesia (MgO) in an appropriate amount and mixing them to form a slurry, and molding the slurry into a sheet by a known drop casing method or calender roll method. Then, the green sheet is subjected to punching in a predetermined shape, the organic solvent or the solvent is added to and mixed with raw powder such as tungsten (W) and a glass material to form a metal paste, and the metal paste is subjected to pattern printing on a surface of the green sheet by a printing method such as screen printing.

Thereby, a conductor pattern, which is to be used for the external connection terminals 23a and 23b, the electrode pads 53a and 53b, and the internal wiring and external wiring (not illustrated), is obtained. Further, the internal wiring and the external wiring may be formed with a through-hole in the green sheet and filling the through-hole with the metal paste by the screen printing. A plurality of green sheets thus obtained are laminated and simultaneously fired at a temperature of about 1600° C., to thereby manufacture the substrate 20.

At this time, the substrate 20 may be obtained by bonding a frame portion having a through-hole which is the housing recess 50 and a simple flat portion. Further, the substrate 20 and the housing recess 50 may be formed by pressing a mold in a state of the green sheets being laminated.

Subsequently, the reflective film 30 is formed on the substrate 20. A thickness of the reflective film 30 is, for example, 0.5 to 2 μm. After the reflective film 30 is formed on the entire surface 21 of the substrate 20 also including the housing recess 50, the reflective film 30 may be formed by photolithography and etching so as to remain only on the side surface 51 of the housing recess 50. On the other hand, the glass material is cut in a predetermined shape by cutting or the like to prepare the lid 13.

The light emitting device 12 is obtained by bonding the lid 13 to the substrate 20 through the bonding material 14, after the light emitting element 11 in the housing recess 50 of the substrate 20 is connected to the electrode pads 53a and 53b by, for example, flip-chip mounting. The light emitting element 11 and the electrode pads 53a and 53b may be connected by adopting other connecting methods such as connecting through a bonding wire and connecting by an anisotropic conductive film. Further, the light emitting device 12 thus obtained is used by being mounted on an external mounting board. For example, a control element for controlling emission of light from the light emitting element 11, an arithmetic element, or the like is also mounted on the external mounting board.

Figure 3:
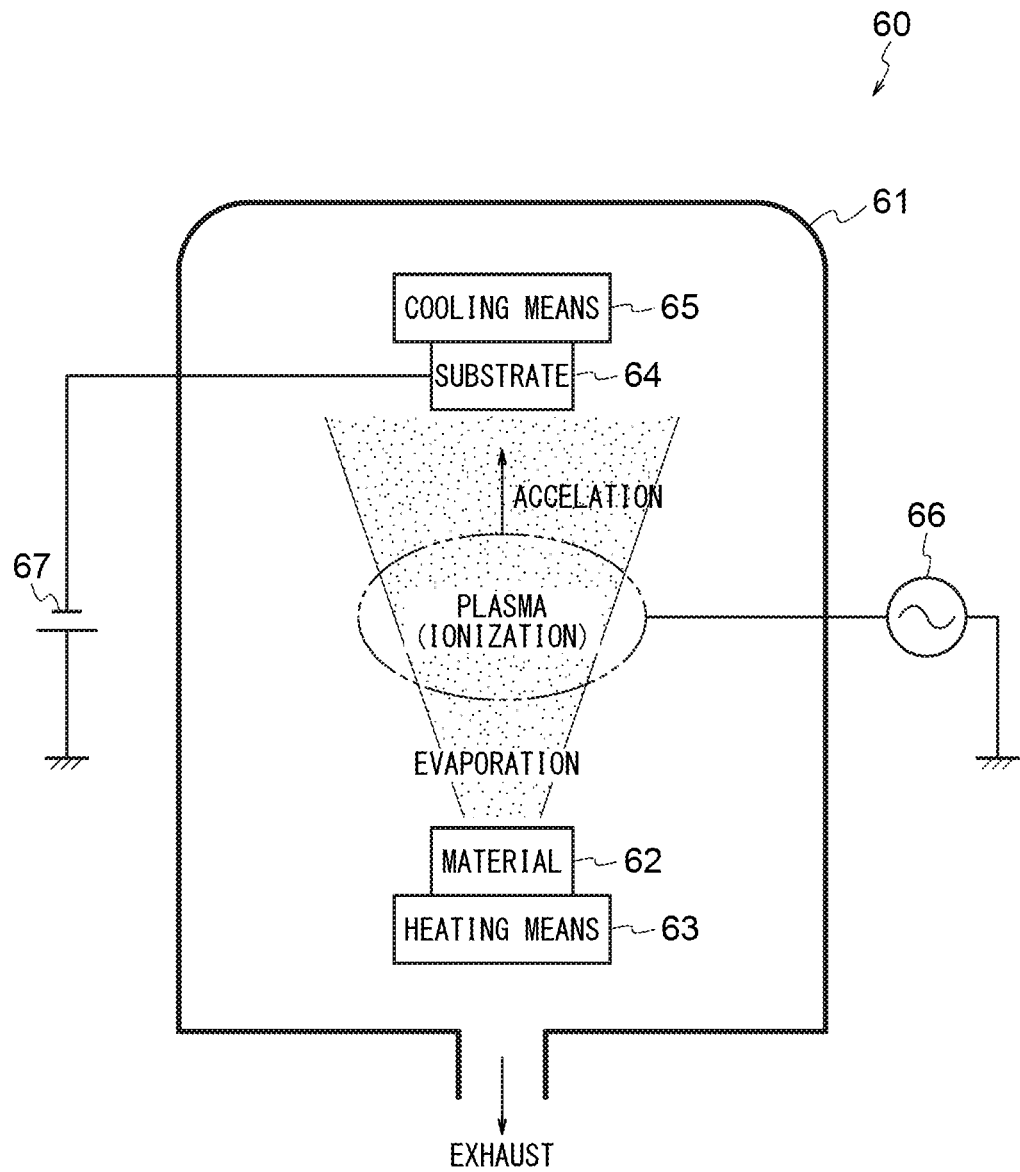
FIG. 3 is a schematic view illustrating an ion plating equipment for forming a reflective film according to the present embodiment.

Next, the reflective film 30 used in the present embodiment will be described in more detail. FIG. 3 is a schematic view illustrating an ion plating equipment for forming the reflective film according to the present embodiment. Hereinafter, the embodiment will be described with reference to FIG. 3.

An ion plating equipment 60 includes a vacuum chamber 61, heating means 63 for heating a material 62 of the reflective film, cooling means 65 for cooling a substrate 64 on which a plurality of substrates are planarly formed, a high frequency power source 66 ionizing an evaporated material 62 by plasma, and a direct current power source 67 applying a bias voltage to the substrate 64. The vacuum chamber 61 houses the heating means 63 and the cooling means 65 in a state where the material 62 and the substrate 64 face each other. The heating means 63 is, for example, an electron beam irradiation unit, and the cooling means 65 is, for example, a water cooling unit. The material 62 is formed of aluminum having a purity of 99.99% or more, and the substrate 64 is formed of ceramic. Note that, a machine rotating and revolving the substrate 64 may be provided in the vacuum chamber 61 so that the ionized material 62 is adhered to a deep portion of the housing recess of the substrate.

The heating means 63 heats the material 62 to evaporate the material 62. The high frequency power source 66 uses, for example, power of 400 to 600 W to ionize the evaporated material 62 by plasma. The direct current power source 67 applies the bias voltage of, for example, −50 V or less to the substrate 64, thereby accelerating the ionized material 62 toward the substrate 64. That is, the ion plating equipment 60 ionizes the evaporated material 62 by plasma, and the ionized material is accelerated and deposited on the substrate 64.

At this time, the cooling means 65 cools the substrate 64. That is, a method of forming the reflective film 30 according to the present embodiment includes evaporating the material 62, ionizing the evaporated material 62, and cooling the substrate if the ionized material 62 is accelerated and deposited on the substrate 64.

In order to obtain an ideal crystal structure of the reflective film, the present inventors have repeated research and experiments on various film forming methods. For example, if the reflective film is formed by aluminum vacuum deposition, since aluminum is amorphized, a surface of the reflective film had a large unevenness. If the reflective film is formed by aluminum sputtering, a plurality of crystal grains grows in a random direction, and finally, the surface of the reflective film has a large unevenness. Further, if a temperature of the substrate 64 is kept at 150° C. or higher if the reflective film is formed by aluminum ion plating, growth of the crystal grains is promoted, and as a result, since the crystal grains increases in size and grows in a horizontal direction (a direction parallel to the surface of the substrate), the surface of the reflective film was not parallel to the surface of the substrate.

Thus, in the present embodiment, the temperature of the substrate 64 is kept at 60° C. to 100° C., and the growth of aluminum crystal grains are prevented and the reflective film of the ideal crystal structure was thus obtained. Furthermore, in the present embodiment, the temperature of the substrate 64 is lowered, and then ionization by plasma and the bias voltage of the substrate are optimized (plasma power: 400 to 600 W, and bias voltage of substrate: −50 V or less), such that proper growth of crystals was achieved and adhesiveness of the reflective film to the substrate 64 could be enhanced. A temperature of the substrate 64 at the time of cooling is preferably 60° C. or higher and 100° C. or lower. The reason why the temperature of the substrate 64 is 60° C. or higher is that the adhesiveness of the reflective film decreases at the temperature of 60° C. or lower, and thus film peeling occurs. The reason why the temperature of the substrate 64 is 100° C. or lower is that the crystal grains of the reflective film excessively grows if the temperature of the substrate 64 exceeds 100° C., such that the surface of the adjacent columnar crystals is not continuous at the surface of the reflective film, and steps are formed on the surface of the reflective film.

Figure 4A:
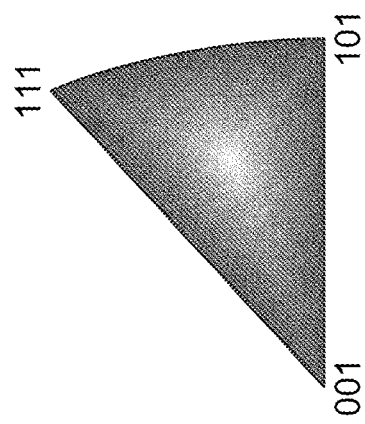
FIG. 4A and FIG. 4B illustrate a cross section of the reflective film formed by the ion plating equipment in FIG. 3.

Next, the crystal structure of the reflective film 30 formed as such will be described in more detail. FIG. 4A and FIG. 4B illustrate a cross section of the reflective film formed by the ion plating equipment in FIG. 3, FIG. 4A is an SEM image, and FIG. 4B is an IPF map illustrating distribution of a crystal orientation in FIG. 4A. Hereinafter, FIG. 4A and FIG. 4B will be described in addition to FIG. 2. The IPF map in FIG. 4B is a color image originally, but a half-tone image illustrating distribution of a crystal orientation.

First, in FIG. 4A and FIG. 4B as in FIG. 2, a right-handed three-dimensional coordinate is set in which a plane averaging a surface 21 of a substrate 20 is defined as an XY plane and a direction perpendicular to the XY plane is defined as a Z direction in FIG. 4A and FIG. 4B. Reference signs 40 to 42 are only added in FIG. 2 and not repeated.

Figure 4A:
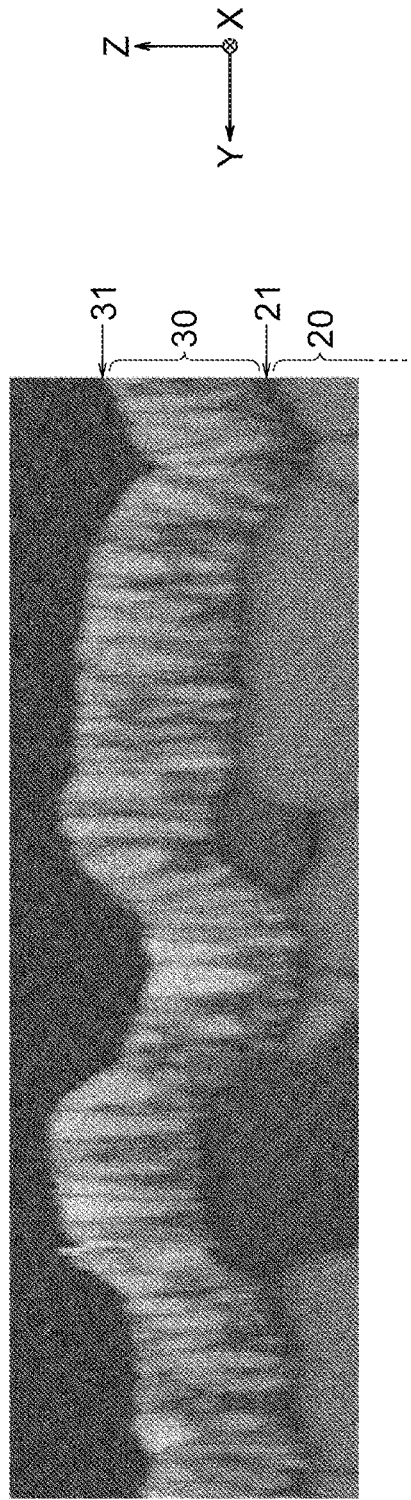
Figure 4B:

As illustrated in FIGS. 2 and 4, the reflective film 30 is formed of a plurality of columnar crystals 40 extending in a perpendicular direction (Z direction) with respect to the surface 21 of the substrate 20. A surface 43 of the adjacent columnar crystals 40 is in continuous at a surface 31 of the reflective film 30. The surface 43 of the columnar crystal 40 being continuous at the surface 31 of the reflective film 30 may have the same shape as the surface 21 of the substrate 20 opposite to the surface 43 of the columnar crystal 40 which is continuous at the surface 31 of the reflective film 30. The plurality of columnar crystals 40 includes first columnar crystals 41 being in direct contact with the surface 21 of the substrate 20 and second columnar crystals 42 in contact with the first columnar crystals 41 without being in direct contact with the surface 21 of the substrate 20.

A surface roughness of the substrate 20 is 130 to 150 nm depending on the unevenness of ceramic crystal grains. A surface roughness of the reflective film 30 is 100 to 130 nm, which is smaller than the surface roughness of the substrate 20. Dense columnar crystals 40 are positioned on the surface 21 of the substrate 20. A crystal grain size of the columnar crystal 40 is 0.1 to 0.5 μm, and the columnar crystals 40 are growing upward (Z direction) regardless the unevenness or waviness from the surface 21 of the substrate 20, or the columnar crystals 40 are growing so that the surface 31 of the reflective film 30 is substantially parallel to the surface 21 of the substrate 20. In other words, the surface 31 of the reflective film 30 reflects the unevenness of the surface 21 of the substrate 20 as it is. The surface 43 of the adjacent columnar crystals 40 is continuously connected to each other, and there are no steps between the surfaces 43 of the adjacent columnar crystals 40. A cross section of the first columnar crystal 41 is an upward protruded triangle, and a cross section of the second columnar crystal 42 is a downward protruded triangle. The second columnar crystals 42 are grown so as to embedded between the adjacent first columnar crystals 41.

Hereinabove, the present invention is not limited to the above embodiment. Various modifications to these exemplary embodiments will be readily apparent to those skilled in the art. Configurations with such changes are included in the technical scope of the present invention.

The present application is based upon and claims priority from Japanese Patent Application No. 2017-185337, filed Sep. 26, 2017, the disclosure of which is hereby incorporated by reference herein in its entirety.

According to the present invention, the wiring board for mounting the light emitting element such as an LED element or an organic EL (OLED) element, and the light emitting device for irradiation or lighting including the wiring board can be used.

The invention claimed is:

1. A wiring board comprising:
   a substrate for mounting a light emitting element; and
   a reflective film positioned on a surface of the substrate and reflecting light rays that are emitted from the light emitting element,
   wherein the reflective film is formed of a plurality of adjacent columnar crystals extending in a perpendicular direction with respect to the surface of the substrate,
   wherein a surface of the plurality of adjacent columnar crystals is in continuous at a surface of the reflective film, and
   wherein the surface of the plurality of adjacent columnar crystal being continuous at the surface of the reflective film has the same shape as the surface of the substrate opposite to the surface of the plurality of adjacent columnar crystal which is continuous at the surface of the reflective film.

2. The wiring board according to claim 1, wherein the reflective film reflects ultraviolet rays having a wavelength of 200 to 400 nm.

3. The wiring board according to claim 1, wherein the reflective film is formed of aluminum.

4. The wiring board according to claim 3, wherein the reflective film reflects ultraviolet rays having a wavelength of 200 to 400 nm.

5. A light emitting device comprising:
   the wiring board according to claim 1; and
   the light emitting element mounted on the substrate.

6. The light emitting device according to claim 5, wherein the light emitting device emits ultraviolet rays having a wavelength of 200 to 400 nm.

7. The wiring board according to claim 1, wherein the plurality of adjacent columnar crystals includes first columnar crystals being in direct contact with the surface of the substrate and second columnar crystals in contact with the first columnar crystals without being in direct contact with the surface of the substrate.

8. The wiring board according to claim 7, wherein the reflective film reflects ultraviolet rays having a wavelength of 200 to 400 nm.

9. The wiring board according to claim 7, wherein the reflective film is formed of aluminum.

10. The wiring board according to claim 9, wherein the reflective film reflects ultraviolet rays having a wavelength of 200 to 400 nm.

11. A wiring board comprising:
    a substrate for mounting a light emitting element; and a reflective film positioned on a surface of the substrate and reflecting light rays that are emitted from the light emitting element,
wherein the reflective film is formed of a plurality of adjacent columnar crystals extending in a perpendicular direction with respect to the surface of the substrate,
wherein a surface of the plurality of adjacent columnar crystals is in continuous at a surface of the reflective film, and
wherein the plurality of adjacent columnar crystals includes first columnar crystals being in direct contact with the surface of the substrate and second columnar crystals in contact with the first columnar crystals without being in direct contact with the surface of the substrate.

12. The wiring board according to claim 11, wherein the reflective film reflects ultraviolet rays having a wavelength of 200 to 400 nm.

13. The wiring board according to claim 11, wherein the reflective film is formed of aluminum.

14. The wiring board according to claim 13, wherein the reflective film reflects ultraviolet rays having a wavelength of 200 to 400 nm.

15. A light emitting device comprising:
the wiring board according to claim 11; and
the light emitting element mounted on the substrate.

16. The light emitting device according to claim 15, wherein the light emitting device emits ultraviolet rays having a wavelength of 200 to 400 nm.

17. A wiring board, comprising:
a substrate for mounting a light emitting element; and
a reflective film positioned on a surface of the substrate and reflecting light rays that are emitted from the light emitting element,
wherein the reflective film is formed of a plurality of adjacent columnar crystals extending in a perpendicular direction with respect to the surface of the substrate,
wherein a surface of the plurality of adjacent columnar crystals is in continuous at a surface of the reflective film, and
wherein the reflective film is formed of aluminum.

18. The wiring board according to claim 17, wherein the reflective film reflects ultraviolet rays having a wavelength of 200 to 400 nm.

19. A light emitting device comprising:
the wiring board according to claim 17; and
the light emitting element mounted on the substrate.

20. The light emitting device according to claim 19, wherein the light emitting device emits ultraviolet rays having a wavelength of 200 to 400 nm.

* * * * *